(12) United States Patent
Ching, Jr. et al.

(10) Patent No.: US 10,734,327 B2
(45) Date of Patent: Aug. 4, 2020

(54) LEAD REDUCTION FOR IMPROVED CREEPAGE DISTANCE

(71) Applicant: NXP USA, Inc., Austin, TX (US)

(72) Inventors: Mariano Layson Ching, Jr., Tianjin (CN); Burton Jesse Carpenter, Austin, TX (US); Jinmei Liu, Tianjin (CN); Yit Meng Lee, Selangor (MY); Allen Marfil Descartin, Cebu (PH)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/238,977

(22) Filed: Jan. 3, 2019

(65) Prior Publication Data

US 2020/0203289 A1    Jun. 25, 2020

(30) Foreign Application Priority Data

Dec. 19, 2018   (CN) .......................... 2018 1 1555986

(51) Int. Cl.
*H01L 23/31* (2006.01)
*H01L 23/00* (2006.01)
*H01L 23/495* (2006.01)

(52) U.S. Cl.
CPC ........ *H01L 23/562* (2013.01); *H01L 23/3114* (2013.01); *H01L 23/49503* (2013.01); *H01L 23/49541* (2013.01)

(58) Field of Classification Search
CPC ............. H01L 23/562; H01L 23/49541; H01L 23/49503; H01L 23/3114
See application file for complete search history.

(56) References Cited

U.S. PATENT DOCUMENTS

| | | | |
|---|---|---|---|
| 5,229,846 A * | 7/1993 | Kozuka | H01L 23/49503 257/666 |
| 5,710,064 A * | 1/1998 | Song | H01L 23/4334 438/123 |
| 6,667,547 B2 | 12/2003 | Woodworth et al. | |
| 2015/0104908 A1* | 4/2015 | Dunipace | H01L 23/49562 438/123 |
| 2017/0301613 A1* | 10/2017 | Lin | H01L 23/49562 |
| 2019/0115291 A1* | 4/2019 | Chen | H01L 24/05 |

OTHER PUBLICATIONS

Analog Devices, "16-Lead Standard Small Outline Package, with Increased Creepage [SOIC_IC] Wide Body," http://www.analog.com/en/design-center/packaging-quality-symbols-footprints/package-index/soic-small-outline-ic/soic-wide.html, 1 page.

NVE Corporation, "Application Bulletin AB-23 NVE Isolators Feature True Eight Millmeter Creepage," ISB-AP-23, www.isoloop.com, Mar. 2013, 2 pages.

* cited by examiner

Primary Examiner — Sitaramarao S Yechuri

(57) ABSTRACT

Embodiments of a lead frame and packaged devices thereof, including a lead frame first and second rows of lead fingers respectively connected to first and second sides of the lead frame, the second side opposite the first side; a package body perimeter within which a package body of the packaged semiconductor device is formed; and a first die pad arm, wherein an end of the first die pad arm remains within the package body perimeter and is separated from the package body perimeter by a gap distance; wherein a first outermost lead finger of the first row of lead fingers is adjacent to the first die pad arm.

21 Claims, 7 Drawing Sheets

LEAD REDUCTION FOR IMPROVED CREEPAGE DISTANCE

BACKGROUND

Field

This disclosure relates generally to integrated circuit packaging, and more specifically, to a lead-frame-based semiconductor die package that satisfies a minimum creepage distance requirement.

Related Art

A semiconductor die is a small integrated circuit (IC) formed on a semiconductor wafer, such as a silicon wafer. Such a die is typically cut from the wafer and packaged using a lead frame. The lead frame is a metal frame that supports the die and provides external electrical connections for the packaged die. The lead frame usually includes a flag (or die pad) and lead fingers (or leads). The semiconductor die is attached to the flag. Bond pads on the die are electrically connected to the leads of the lead frame with bond wires. The die and bond wires are covered with an encapsulant to form a semiconductor die package. The leads are trimmed and formed to either project outwardly from the encapsulation or are at least flush with the encapsulation so they can be used as terminals, allowing the packaged die to be electrically connected to other devices or a printed circuit board (PCB).

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Lead-frame-based semiconductor die packages need to meet a minimum creepage distance required by industry standards. Creepage distance is the shortest distance between a pair of conductors (such as two leads at different electrical potentials) along a surface of solid insulation material (such as a package body of a semiconductor die package). The necessary creepage distance may vary for a given device, depending on the application voltage, environment, and material selection of the device. For example, international industry standards provide a minimum creepage distance of 8.0 mm in devices for certain high voltage applications. Creepage distances that are shorter than the minimum creepage distance may give rise to current tracking or "creeping" along the surface of the solid insulation material between two leads at different electrical potentials, which in turn may cause breakdown of the insulation material between the two leads. Lead frames that include metal tie bar structures have a further reduced creepage distance that often fails to meet the minimum creepage distance, which can be especially problematic when such lead frames are used in semiconductor die packages for high voltage applications as discussed below.

Figure 1:
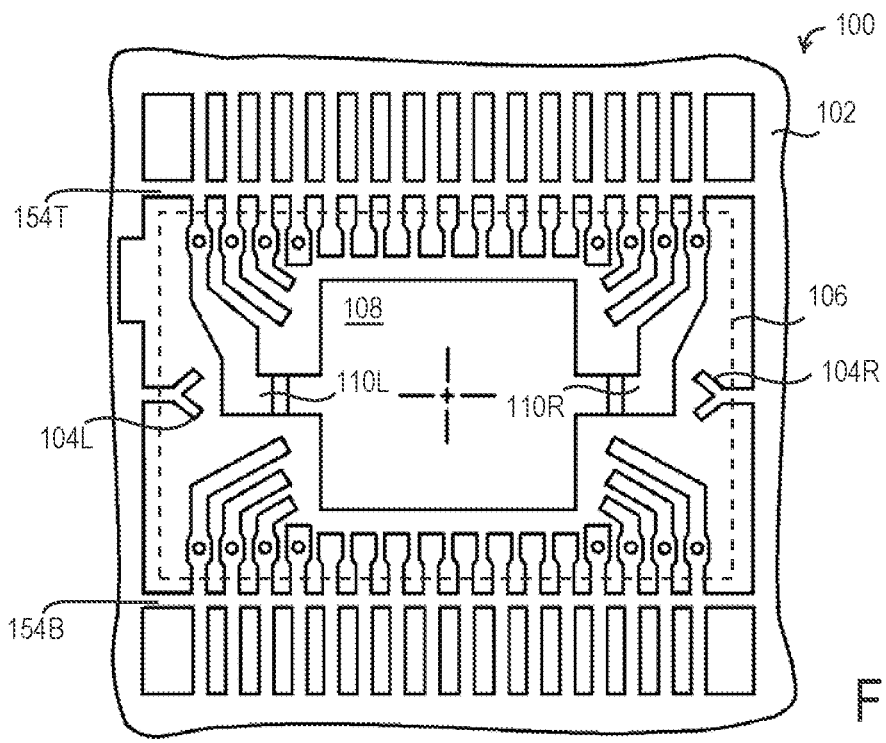
FIG. 1, FIG. 2, and FIG. 3 illustrate block diagrams depicting various views of a semiconductor die package built on an example lead frame.

FIG. 1 shows a top-down view of an example lead frame 100 having a problem with creepage distance. Lead frame 100 has a top row of lead fingers and a bottom row of lead fingers that are respectively connected to opposite edges of a surrounding frame structure 102 (also referred to as leaded edges of the frame structure 102 or lead frame 100). As shown, a top dam bar 154T runs across and connects the top row of lead fingers, and a bottom dam bar 154B runs across and connects the bottom row of lead fingers. The lead frame 100 also includes a die pad 108 for a semiconductor die and a pair of die pad arms 110L and 110R that are respectively connected to outermost lead fingers on either side of the top row of lead fingers (e.g., to the leftmost and rightmost lead fingers of the top row). A package body perimeter 106 (illustrated as a box with a dashed line) laterally surrounds the die pad 108 and indicates where a package body will be formed on the lead frame 100 between the top and bottom dam bars. Tie bar structures 104L and 104R are respectively located on opposing non-leaded edges of the frame structure 102 (e.g., edges of the frame structure 102 or lead frame 100 that do not include leads, which are perpendicular to leaded edges) and extend into the package body perimeter 106 toward the die pad 108. The lead frame 100, including the tie bar structures 104L and 104R, is made from a conductive material, such as copper.

Figure 2:
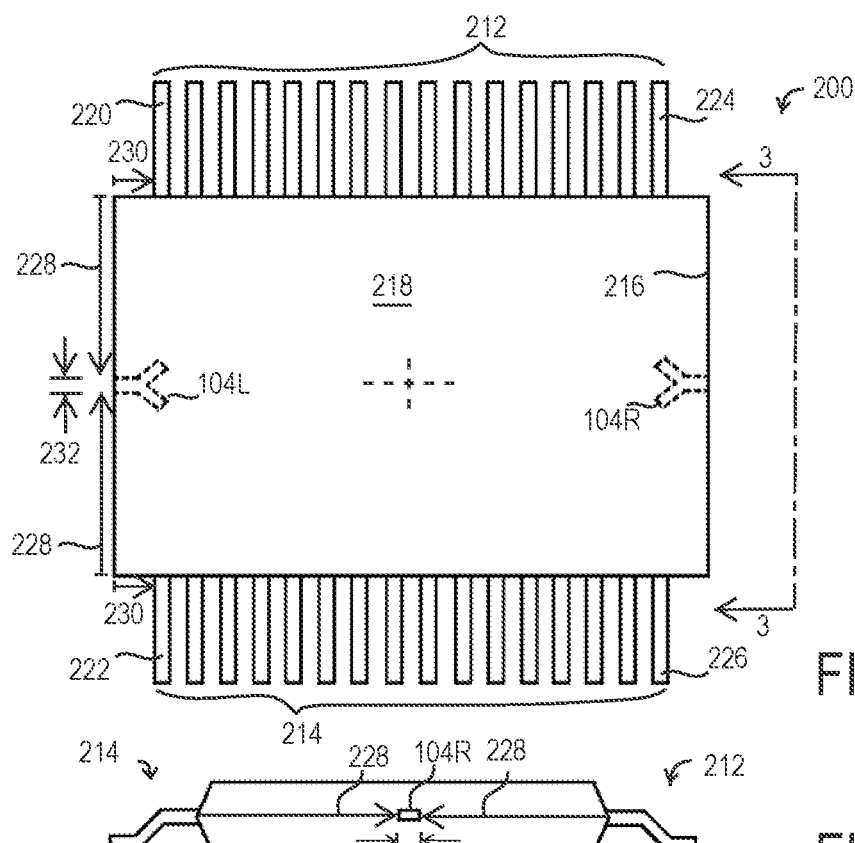

FIG. 2 shows a top-down view of a resulting semiconductor die package 200 after an encapsulation process forms a package body 218 on the lead frame 100. The encapsulation process includes placing the lead frame 100 within a mold cavity of mold tooling, such as a mold chase that closes around the lead frame and clamps onto the dam bars. Liquid encapsulant material is injected into the mold cavity and cured to form package body 218 that surrounds a semiconductor die attached to the die pad 108 and any bond wires between the die and inner portions of the lead fingers. The tie bar structures 104L and 104R are also embedded within the package body 218, which hold the package steady during a subsequent trim and form process to trim away and shape outer portions of the lead fingers into leads. In the example shown, two sets of leads 212 and 214 are formed that extend outward from opposing sides of the package body 218. It is noted that the package body 218 has an outer lateral edge or surface 216, which corresponds to the package body perimeter 106 of FIG. 1. The package 200 is then singulated from the surrounding frame structure 102, which cuts the tie bar structures 104L and 104R from the surrounding frame structure 102 at the surface 216 of the package body 218.

Portions of the tie bar structures 104L and 104R that remain within the package body 218 after singulation are shown in broken lines.

In order for the semiconductor die package 200 to achieve high voltage isolation, the outermost leads of the top row 212 and bottom row 214 need to be separated by a minimum creepage distance, such as 8.0 mm. For example, on the left side of the package 200, the top left outermost lead 220 may be at a low potential while the bottom left outermost lead 222 may be at a high potential (also referred to as a left pair of outermost leads). Similarly on the right side of the package 200, the top right outermost lead 224 and bottom right outermost lead 226 (also referred to as a right pair of outermost leads) may be at different potentials. While the left pair and the right pair of outermost leads are each separated by a respective non-leaded side of the package 200, the remnants of the tie bar structures 104L and 104R (also referred to as simply tie bar remnants 104) that remain at the surface 216 of the package body 218 on the non-leaded sides act as intermediate conductors, which reduces the creepage distance. Since the tie bar remnants 104 are electrically floating (e.g., not connected to either the high potential or the low potential), the creepage distance between the left pair of outermost leads 220 and 222 is reduced by the width 232 of the remnant 104L, and the creepage distance between the right pair of outermost leads 224 and 226 is similarly reduced by the width 232 of the remnant 104R. For example, the width 232 may be in the range of 0.2 to 0.3 mm. The creepage distance shown in FIG. 2 is equal to the sum of distance 230 measured from the top left outermost lead 220 to the top left corner, distance 228 measured from the top left corner to remnant 104L, distance 228 measured from remnant 104L to the bottom left corner, and distance 230 measured from the bottom left corner to the bottom left outermost lead 222.

Figure 3:
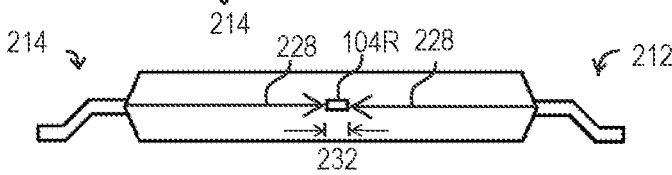

FIG. 3 also shows a head-on end view of the resulting semiconductor die package 200, showing a similar creepage distance between right outermost leads 224 and 226 equal to twice the sum of distances 228 and 230 (which is equal to the shortest path between the pair of outermost leads minus the width 232 of tie bar remnant 104). For example, the right pair of outermost leads 224 and 226 (or left pair of outermost leads 220 and 222) may be physically separated by at least 8.0 mm of solid insulation material, but that distance is reduced by the presence of the intervening remnants of tie bar structures 104 between the outermost leads, resulting in a creepage distance that fails to meet the required minimum creepage distance.

Figure 4:
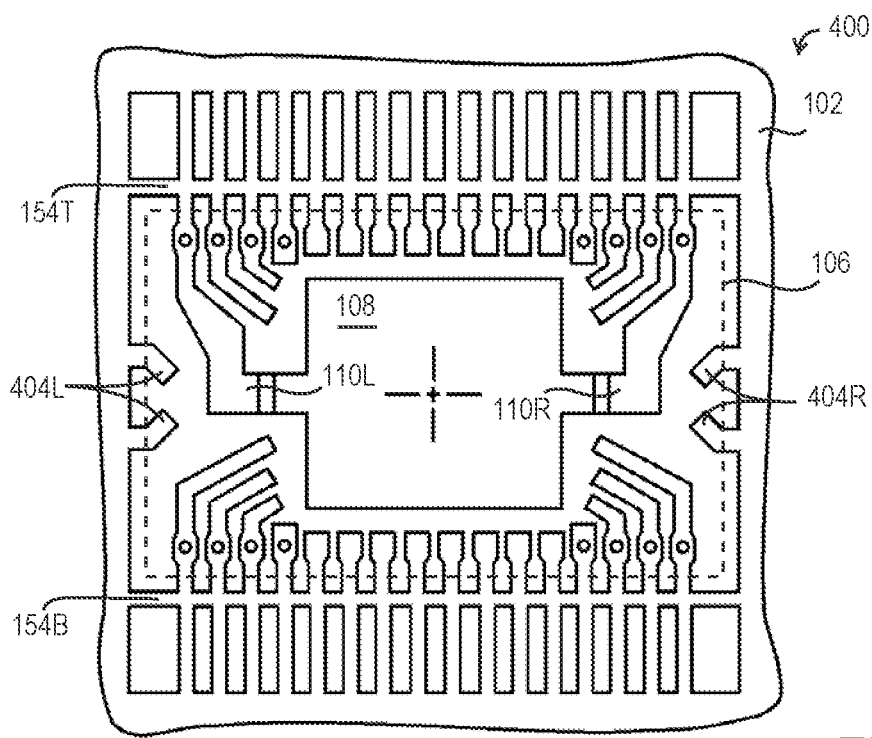
FIG. 4, FIG. 5, and FIG. 6 illustrate block diagrams depicting various views of a semiconductor die package built on an example lead frame.

FIG. 4 illustrates another example lead frame 400 having a greater problem with creepage distance. Lead frame 400 is similar in structure and dimension to lead frame 100, with the exception of tie bar structures 404L and 404R each implementing two prongs separated by a distance that may accommodate a dam block or similar structure on the mold tooling. For example, when the lead frame 400 is placed within the mold cavity of the mold tooling, a dam block fits into the separation between prongs of tie bar structures 404L and 404R and remains outside of the perimeter 106. When the encapsulation material is cured, the dam block is adjacent to the resulting package body, preventing the encapsulation material from extending past the intended package body perimeter 106 at the tie bar structure 404.

Figure 5:
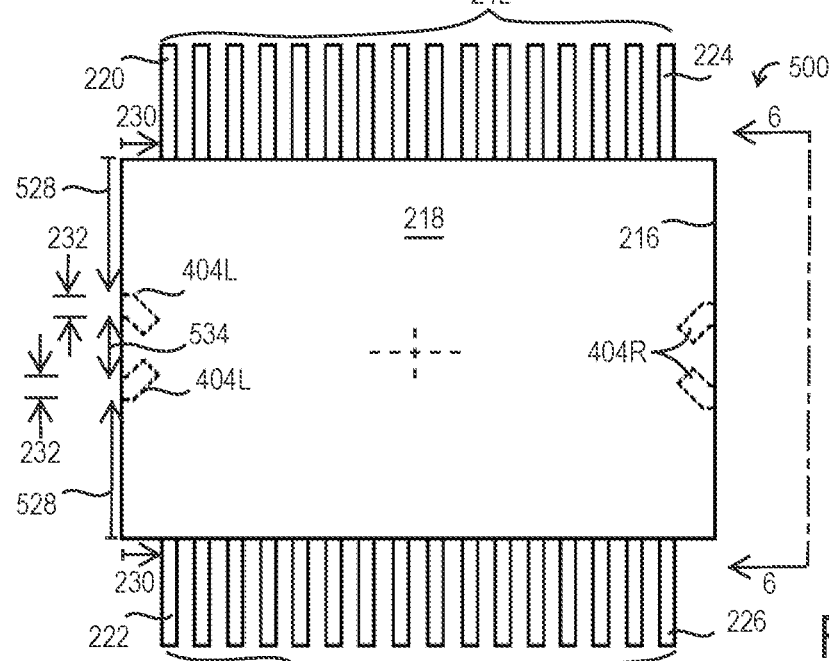

FIG. 5 shows a top-down view of a resulting semiconductor die package 500 after similar encapsulation, trim and form, and singulation processes, as discussed above. The left pair of outermost leads 220 and 222 and the right pair of outermost leads 224 and 226 each need to be separated by a minimum creepage distance to achieve adequate high voltage isolation. However, the tie bar remnants 404L and 404R that remain at the surface 216 of the package body 218 are conductors that reduce the creepage distance. Further, since the remnants 404L and 404R each implement two prongs, where each prong has a width 232, the creepage distance measured between the left pair of outermost leads 220 and 222 is reduced by twice the width 232. For example, the width 232 may be in the range of 0.2 to 0.3 mm, resulting in twice the width 232 falling in the range of 0.4 to 0.6 mm. The creepage distance shown in FIG. 5 is equal to the sum of distance 230 measured from top left outermost lead 220 to the top left corner, distance 528 from the top left corner to the top prong of remnant 404L, distance 534 between the top and bottom prongs of remnant 404L, distance 528 from the bottom prong to the bottom left corner, and distance 230 from the bottom left corner to bottom left outermost lead 222.

Figure 6:
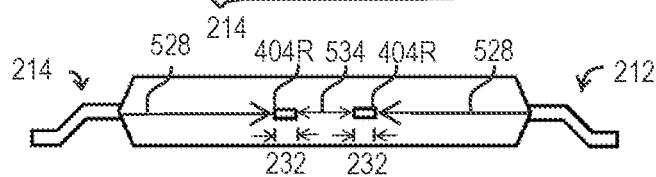

FIG. 6 also shows a head-on end view of the resulting semiconductor die package 500, similarly showing a creepage distance between right outermost leads 224 and 226 equal to twice the combination of distances 230 and 528, plus distance 534 (which is equal to the shortest path between the pair of outermost leads minus twice the width 232). Again, even though the right pair of outermost leads 224 and 226 (or left pair of outermost leads 220 and 222) may be physically separated by at least 8.0 mm of solid insulation material, that distance is reduced by the presence of any intervening remnants of tie bar structures 404, resulting in a creepage distance that fails to meet the minimum creepage distance requirement.

The present disclosure provides a modified lead frame design for a semiconductor die package in which two or more corner leads are removed to compensate the creepage distance loss contributed by the presence of intervening tie bar structures in the package, without changing the pitch of the remaining leads. As used herein, a corner lead on the package corresponds to a corner lead finger on the lead frame, which is an outermost lead finger closest to a respective corner (e.g., top left, bottom left, top right, bottom right) of the lead frame. The removal of one corner lead finger from the left side or the right side of the lead frame provides a corresponding increase in the creepage distance of the package by the width of the removed corner lead finger and by the spacing width between the removed corner lead finger and the next lead finger, which becomes the "new" outermost lead finger for measuring creepage distance. The combination of the lead width and spacing width may be referred to herein as lead pitch. The removal of both corner lead fingers from the left side or the right side of the lead frame provides a corresponding increase in the creepage distance by twice the lead pitch. The modified lead frame may also implement a non-conductive support structure to provide structural integrity for the die pad of the lead frame, in embodiments where the removed corner lead fingers leave the die pad arms unconnected to the lead frame.

It is noted that this approach makes use of existing assembly tools, with minimal modifications made to the trim and form tooling due to the reduced lead count of the disclosed lead frame. Since the mold tooling clamps onto the dam bar, the existing mold tooling can be used, regardless of the number of lead fingers that are removed. There is minimal impact in the existing end user board layout or PCB since the resulting package body dimensions and the pitch of the remaining leads stay the same (e.g., some corner land pads on the PCB would be unused).

EXAMPLE EMBODIMENTS

Figure 7A:
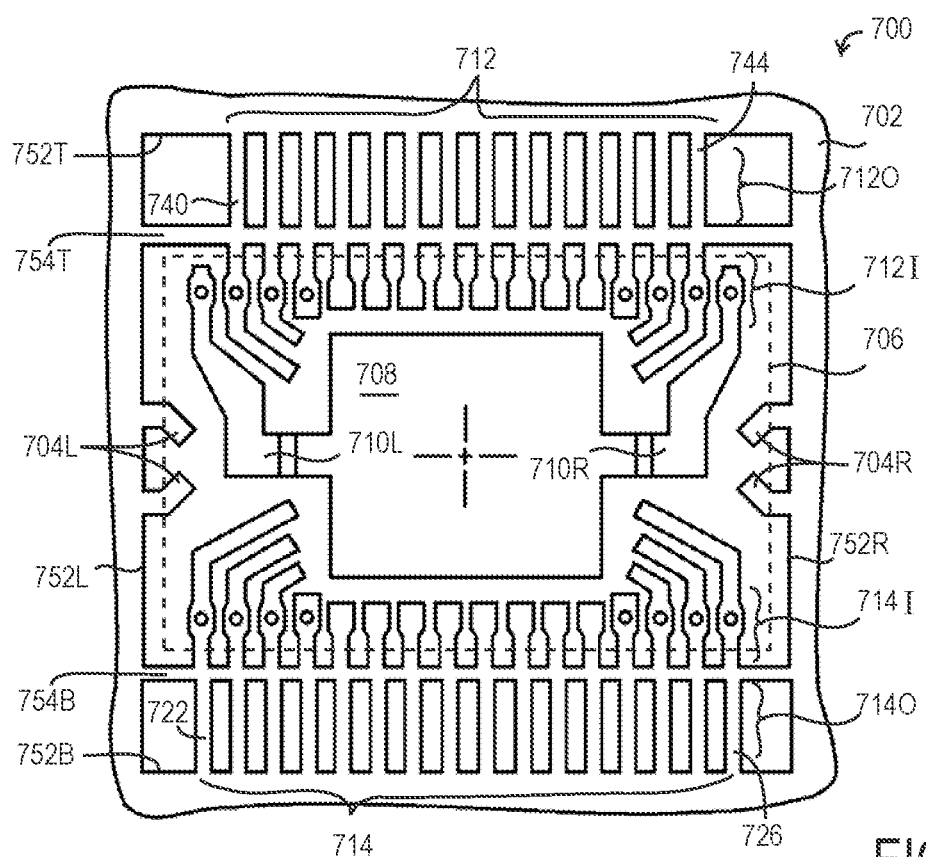
FIGS. 7A, 7B, 7C, and 7D illustrate block diagrams depicting various views of a semiconductor die package built on an example lead frame in which the present disclosure is implemented, according to some embodiments.

FIG. 7A illustrates a top-down view of an example conductive lead frame 700 in which the present disclosure is implemented. The lead frame 700 (and other lead frames illustrated herein) implements a small outline integrated circuit (SOIC) lead frame design, although the lead frame disclosed herein may be differently shaped in other embodiments (e.g., dual in-line package (DIP), small outline package (SOP), and the like). The lead frame 700 may be a unit lead frame, which may be one of a number of unit lead frames in a lead frame array. The disclosed lead frame may be implemented or formed by an etching or stamping process, which may be performed on a lead frame blank or on a formed intermediate lead frame, individually or in an array of lead frames. While the lead frame 700 (and similarly lead frames 800, 900, and 1000) implement an example number of lead fingers (also referred to as a lead count), other numbers of lead fingers may be implemented in other embodiments. The lead frames shown herein have symmetrical left and right sides, although the left and right sides may not be symmetrical in other embodiments.

Figure 7B:
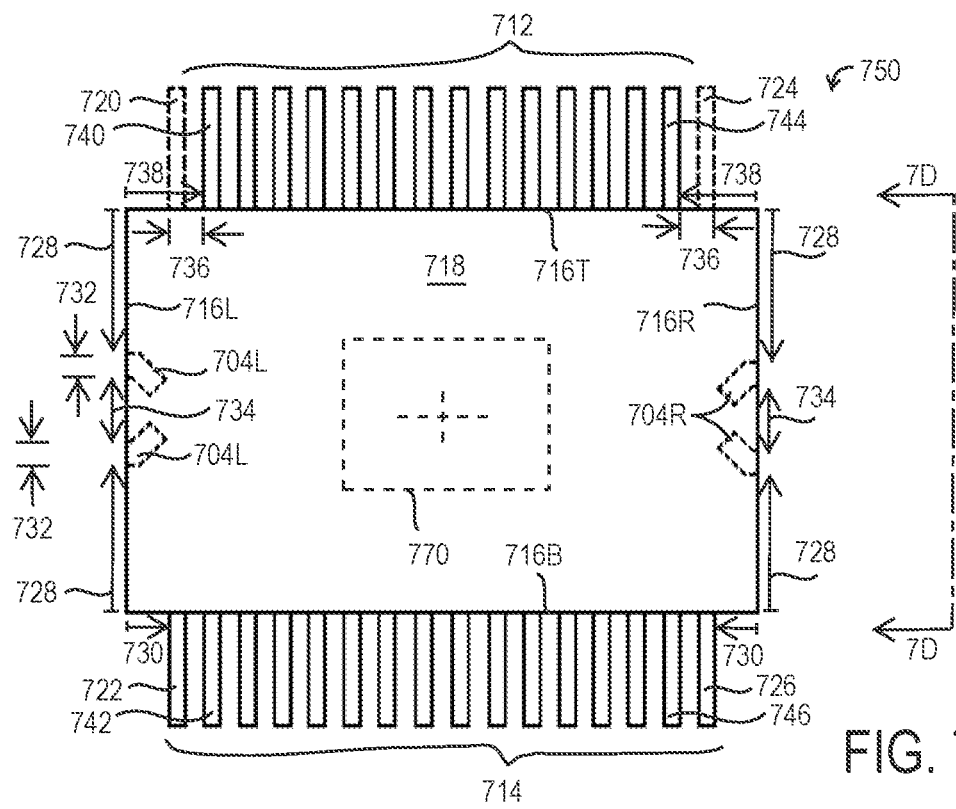

Lead frame 700 includes a die pad 708 for supporting a semiconductor die, where die pad 708 is centered within a frame structure 702 of the lead frame 700, as shown by the horizontal and vertical midlines of the lead frame that are centered within die pad 708. Die pad 708 is also connected to die pad arms 710L and 710R, which will be further discussed below. Die pad 708 is laterally surrounded by a package body perimeter 706, which is illustrated with a dashed line laterally separated from the edges of the die pad 708. The package body perimeter 706 indicates where a corresponding edge of the package body will be formed during encapsulation, where the package body 718 is formed within the package body perimeter 706, as shown in FIG. 7B.

Lead frame 700 also includes tie bar structures 704L and 704R. Tie bar structure 704L includes two prongs or tabs that extend from a left interior edge 752L of the surrounding frame structure 702 of the lead frame 700 toward die pad 708. Tie bar structure 704R similarly includes two prongs that extend from a right interior edge 752R of the surrounding frame structure 702 of the lead frame 700 toward die pad 708, where edge 752R is opposite edge 752L. Each prong of structures 704L and 704R is equidistant from a horizontal midline of the lead frame (e.g., the structures 704L and 704R are respectively centered on edges 752L and 752R). Edges 752L and 752R may also be referred to as non-leaded sides or edges of the lead frame 700. While the lead frame 700 shown implements tie bar structures 704L and 704R that are similar to tie bar structures 404L and 404R, the lead frame disclosed herein may implement differently shaped tie bar structures in other embodiments, such as tie bar structures similar to tie bar structures 104L and 104R.

Lead frame 700 also includes two sets of lead fingers 712 and 714, which are arranged in rows (e.g., each lead finger in a row is parallel to its neighboring or laterally adjacent lead finger) on opposing sides of the die pad 708. Each lead finger (in both rows 712 and 714) has a uniform lead width and is separated from an adjacent lead finger by a uniform spacing width. Each lead finger 712 and 714 has a respective inner end or portion 712I and 714I that neighbors (e.g., is laterally adjacent to) and is laterally separated from the die pad 708, and a respective outer end or portion 712O and 714O that extends away from the die pad 708. Outer portions 712O and 714O are respectively connected to either a top interior edge 752T or a bottom interior edge 752B of the surrounding frame structure 702 of the lead frame. Edges 752T and 752B may also be referred to as leaded sides or edges of the lead frame 700 (e.g., an edge having attached lead fingers). The outer portions 712O and 714O are also respectively connected to one another either by a top dam bar 754T or a bottom dam bar 754B. The dam bars 754T and 754B, in combination with the mold tooling, prevent remnants of mold compound from extending beyond the dam bars during encapsulation. The inner portions 712I and 714I of the lead fingers fall within the package body perimeter 706 and form electrical connection contact areas to which a semiconductor die is electrically connected. In other words, package body perimeter 706 is located in an area between the top and bottom dam bars 754T and 754B, where the area also overlaps tie bar structures 704L and 704R.

The design of the disclosed lead frame starts with a reference number of lead fingers, also referred to as a reference lead count. In the embodiment shown, the lead frame 700 has a reference lead count of 32, comparable to the lead count of 32 of the lead frame shown in FIG. 4. In order to compensate the creepage distance loss arising from the width of the intervening tie bar structures 704L and 704R, a number of corner lead fingers are removed from the design of the disclosed lead frame. In the embodiment shown in FIG. 7A, two top corner lead fingers are removed from the design, one from the left side and one from the right side of the lead frame, resulting in an implemented lead count that is smaller than the reference lead count by two. The remaining lead fingers of the lead frame are not altered (e.g., the lead pitch remains the same). In other words, the lead frame 700 implements a top row 712 having two fewer lead fingers than the bottom row 714, due to the (absent) top left and top right corner lead fingers 720 and 724 that would have been connected to the die pad arms 710L and 710R on either side of the top row 712. The absent corner lead fingers 720 and 724 are represented by a broken outline in FIG. 7B. The lead fingers 740 and 744 respectively adjacent to the removed corner lead fingers in the top row 712 become the "new" outermost lead fingers used for measuring creepage distance.

It is noted that die pad arms 710L and 710R are not removed, but instead are shortened (e.g., as compared with arms 410L and 410R) such that the ends of arms 710L and 710R are separated from the top dam bar 754T and remain within package body perimeter 706. In particular, the ends of die pad arms 710L and 710R are separated from the package body perimeter 706 by a gap distance 768, as further shown in FIG. 7C. The ends of die pad arms 710L and 710R are respectively aligned with the outer portions 714O of outermost lead fingers 722 and 726 on the bottom row of lead fingers 714, and the outer portions 712O of the top row of lead fingers 712 are aligned to the outer portions 714O of the bottom row of lead fingers 714 between lead fingers 722 and 726 (e.g., outer portions 712O and end of arms 710L and 710R in the top row are vertically aligned with a respective outer portion 714O in the bottom row). Since the die pad arms 710L and 710R are not connected to the dam bar 754T or to the frame structure 702 of the lead frame, additional non-conductive support structures 760 are implemented to provide structural integrity and stability for the die pad 708, as also further shown in FIG. 7C.

While a reference lead count of 32 is used herein, other reference lead counts may be used, such as 28 (where the disclosed lead frame implements 26 leads) or 54 (where the disclosed lead frame implements 52 leads). Different embodiments of the disclosed lead frame implementing two or more removed corner lead fingers are discussed below in connection with FIGS. 8A, 9A, and 10A.

The lead frame 700, including the frame structure 702, lead fingers 712 and 714, die pad 708, arms 710L and 710R, dam bars 754T and 754B, and retention tabs 704L and 704R discussed above, are formed from an electrically conductive material, examples of which include but are not limited to copper, nickel, or an alloy thereof. Electrical connection contact areas on the lead frame 700 (such as on the inner portions 712I and 714I for electrical connections made to a die or on the outer ends 712O and 714O for external electrical connections) may also be coated with an electrically conductive material, examples of which include nickel, gold, copper, aluminum, tin, or other suitable conductive metal or alloy composed of one or more suitable conductive metals.

FIG. 7B shows a top-down view of a resulting semiconductor die package 750 after a semiconductor die 770 (shown in dashed outline) is attached to die pad 708, and after wirebonding, encapsulation, trim and form, and singulation. It is noted that the disclosed lead frame (such as lead frames 700, 800, 900, and 1000) can be placed in existing mold tooling to form a package body 718 on the disclosed lead frame (e.g., the same mold tooling used to encapsulate lead frames like that shown in FIG. 4 can be reused). In one embodiment, package body 718 is made of an encapsulant material such as a mold compound based on a biphenyl type or multi-aromatic type epoxy resin, but may be other types of encapsulating materials in other embodiments. The encapsulating may be performed by an encapsulating method, such as transfer molding or other types of other encapsulating methods. The existing trim and form tooling may also be used to complete formation of the resulting package 750, with minimal alterations made to the trim and form tooling to account for the lack of the two or more corner lead fingers.

Package body 718 has an outer lateral surface on four sides, 716T, 716B, 716L, and 716R that correspond to package body perimeter 706 (shown in FIG. 7A), with the left pair of outermost leads separated by non-leaded side 716L and the right pair of outermost leads separated by non-leaded side 716R. Lead fingers 712 and 714 form corresponding leads 712 and 714 that extend from opposite sides 716T and 716B of package body 718. Lead fingers or leads 712 and 714 may also be respectively characterized as active lead fingers or active leads because the leads formed from these lead fingers are active (e.g., convey signals at various voltage potentials) when the semiconductor die package 750 is powered during operation. Portions of the tie bar structures 704L and 704R that remain within package body 718 after singulation are shown in broken lines, each prong having a width 732.

It is noted that the package body 718 formed on the disclosed lead frame has comparable dimensions (e.g., length and width) as compared to a package body 218 (e.g., shown in FIG. 5) formed on a lead frame that implements the reference lead count, although the disclosed lead frame implements a smaller lead count. For example, package body 718 has a length (e.g., long length of sides 716T and 716B) that may fall in a range of 10.9 to 11.1 mm, and a width (e.g., short length of sides 716L and 716R) that may fall in a range of 7.4 to 7.6 mm for an implemented lead count of 30, which corresponds to similar dimensions for a package body 218 for a lead frame 400 that implements a lead count of 32. It is noted that the example dimensions provided herein may vary depending on lead frame placement tolerances during encapsulation.

The creepage distance shown on the left side of the package 750 is equal to the sum of distance 738 measured from the top left outermost lead 740 to the top left corner along leaded edge 716T, distance 728 from the top left corner to the top prong of remnant 704L along non-leaded edge 716L, distance 734 between the top and bottom prongs, distance 728 from the bottom prong to the bottom left corner along non-leaded edge 716L, and distance 730 from the bottom left corner to the bottom left outermost lead 722 along leaded edge 716S. Since the lead frame 700 and package 750 are symmetrical about the vertical midline in the embodiment shown, the creepage distance on the right side of the package 750 is equal to the creepage distance on the left side. Also in the embodiment shown, distance 738 is greater than distance 730 by a distance 736 resulting from the removal of top left corner lead 720. Distance 736 is equal to the uniform lead pitch implemented in the lead frame 700, where the lead pitch is equal to the uniform lead width 762 plus the uniform spacing width 764, as further shown in FIG. 7C. Distance 736 is also gained on the right side of the package 750 resulting from the removal of top right corner lead 724. For example, by removing top corner leads 720 and 724, the creepage distance between outermost lead 740 (on the top row) and outermost lead 722 (on the bottom row) is increased by distance 736, and similarly between outermost lead 744 (on the top row) and outermost lead 726 (on the bottom row).

For example, distance 730 may fall in a range of 0.4 to 0.5 mm, width 732 may fall in the range of 0.2 to 0.3 mm, while distance 736 may fall in the range of 0.6 to 0.7 mm (or the lead pitch of the lead frame). Assuming a worst case of width 732 equal to 0.3 mm, an example creepage distance of package 750 with two intervening prong remnants may fall in a range of 8.1 to 8.5 mm (which may also vary depending on the number of intervening tie bar remnants still present at the package surface on sides 716L and 716R), which satisfies the minimum creepage distance of 8.0 mm.

Further, since die pad arms 710L and 710R remain within and are surrounded by the package body 718, the arms 710L and 710R do not introduce any conductive remnants at the surface 716T and do not further decrease creepage distance. It is noted that the creepage distance between a pair of outermost leads is increased by the absence of two or more corner lead fingers, and that the package body 718 is not being extended outward from the lead frame 700 any more than the package body 218 is extended outward from the lead frame 400 using the same mold tooling (e.g., the creepage distance is not increased by superficially adding to the length of the package body 718).

It is also noted that since the arms 710L and 710R are not connected to leads, the die pad 708 may be floating during operation of package 750. By contrast, a package (like that shown in FIG. 5) having arms 410L and 410R connected to leads may have a grounded flag, where such leads would be connected to ground pins on a PCB. Additionally, while the overall lead count of package 750 has been reduced by two, the lead count still satisfies the required number of I/O (input/output) connections for signal and power. A head-on view of the resulting semiconductor die package built on lead frame 700 is shown in FIG. 7D, which indicates the improved creepage distance can be achieved even while remnants 704 are present at the surface of the package body 718. While leads 712 and 714 are shown in a gull wing shape in FIG. 7D, the leads 712 and 714 may be differently shaped in other embodiments, such as J-shaped.

Figure 7C:
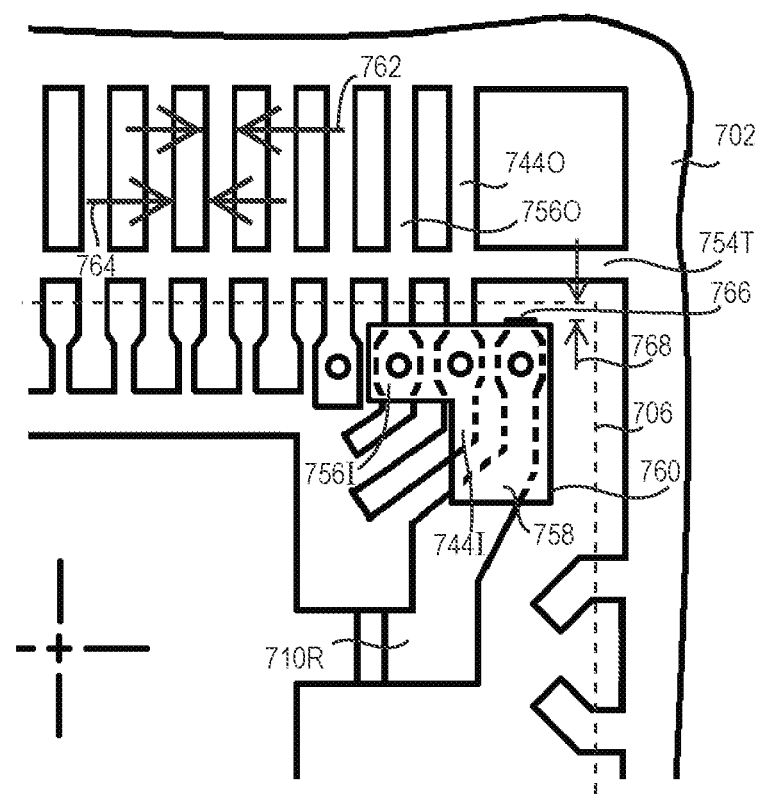
Figure 7D:
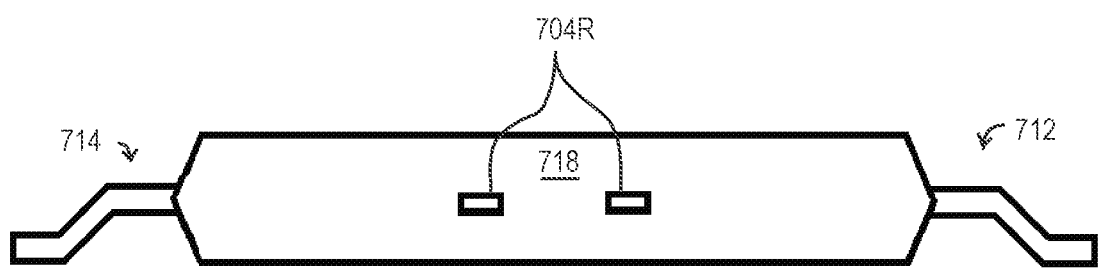

FIG. 7C shows a top right corner portion of the lead frame 700 in additional detail. In the embodiment shown, the end 766 of die pad arm 710R is separated from the package body perimeter 706 by a gap distance 768. To maintain adequate structural integrity of the die pad 708, support structure 760 is attached to a portion 758 of the die pad arm 710R and to one or more neighboring lead fingers, as discussed below. Lead frame 700 is symmetrical about the vertical midline, and another non-conductive support structure 760 is attached to die pad arm 710L and to one or more neighboring lead fingers in a mirrored fashion.

Lead width 762 and spacing width 764 between lead fingers are also shown in FIG. 7C. It is noted that lead width 762 and spacing width 764 are uniform across the lead fingers 712 and 714. For example, lead width 762 may fall in a range of 0.25 to 0.35 mm, and spacing width 764 may fall in a range of 0.4 to 0.3 mm (or the combination of lead width 762 and spacing width 764 may also be described as lead pitch of 0.65 mm).

As shown, support structure 760 is attached to lead finger 744 that is immediately adjacent to die pad arm 710R and to lead finger 756 that is the next adjacent lead finger to die pad arm 710R. Support structure 760 may be attached to additional or fewer lead fingers in other embodiments. Further, while support structure 760 is shown as attached to the top surface of the arm 710R and top surfaces of inner portions 744I and 756I of the neighboring lead fingers, support structure 760 may instead be attached to the bottom surface of the die pad arm portion 758 and bottom surfaces of inner portions 744I and 756I of the neighboring lead fingers in other embodiments. In some embodiments, the surfaces to which the support structure 760 is attached are co-planar. The ends of inner portions 744I and 756I are bonding surfaces for wirebonds to a semiconductor die 770 on die pad 708. The support structure 760 is attached away from these ends to ensure adequate bonding surface area for proper wirebonding. The total surface area to which the support structure 760 is attached should be large enough to provide sufficient structural integrity and rigidity to the die pad 708, even when a semiconductor die 770 is mounted to the die pad 708.

Non-conductive support structure 760 is made of a non-conductive material, examples of which include but are not limited to one or more of plastic materials, organic polymers, inorganic polymers, polyimides, elastomers, glass fabric, and the like. A non-conductive support structure 760 is attached or bonded to a die pad arm and one or more neighboring lead fingers by a non-conductive adhesive material, examples of which include but are not limited to polymer adhesives, acrylic adhesives, epoxies, pastes, films, thermal interface material (TIM), and the like. Thermal interface material (TIM) is heat conductive, examples of TIM include, but are not limited to, silicone or epoxy-resin based material containing suspended carbon nanotubes, or beryllium oxide, boron nitride, diamond powders, ceramic powders, or other thermally conductive fillers. The non-conductive adhesive materials may be in curable (e.g., by heat or ultraviolet light radiation) or non-cured (e.g., pressure sensitive adhesives) forms. When attached or bonded to the lead frame, each non-conductive support structure 760 has sufficient peel strength to avoid being removed or peeled, and sufficient shear strength to avoid being torn or sheared, off the arm and one or more lead fingers during typical lead frame handling (e.g., during encapsulation process). It is also noted that the non-conductive material and non-conductive adhesive material are able to withstand the high temperatures experienced during typical lead frame handling (e.g., before and during encapsulation process, such as wirebonding), with minimal changes to the properties of those materials.

In some embodiments, the non-conductive support structure 760 is formed from thermal tape, which may be a non-conductive material that includes a non-conductive adhesive material, where examples of such materials include those examples provided above. In some embodiments, thermal tape may itself be a layer or film or other structure made of non-conductive adhesive material that provides sufficient peel strength and shear strength. It is also noted that each non-conductive support structure 760 discussed herein includes one or more portions of non-conductive material attached to a die pad arm and one or more neighboring lead fingers of a conductive lead frame, where the one or more portions of non-conductive material may be formed from a single piece of non-conductive material (i.e., a "portion" of the non-conductive material may not necessarily indicate a physically separate piece of non-conductive material, but may instead refer to a part of the whole piece of non-conductive material).

The non-conductive support structure 760 may be formed as a single structure in some embodiments, and may be formed as separate sub-structures in other embodiments. While the non-conductive support structure 760 shown in FIG. 7C is a single L-shaped piece, the non-conductive support structure 760 may be formed from one or more differently shaped pieces of non-conductive material or non-conductive adhesive material, such as one or more strips, squares, boxes, triangles, or other polygonal-shaped pieces, or circular, oblong, amorphous shaped pieces.

Figure 8A:
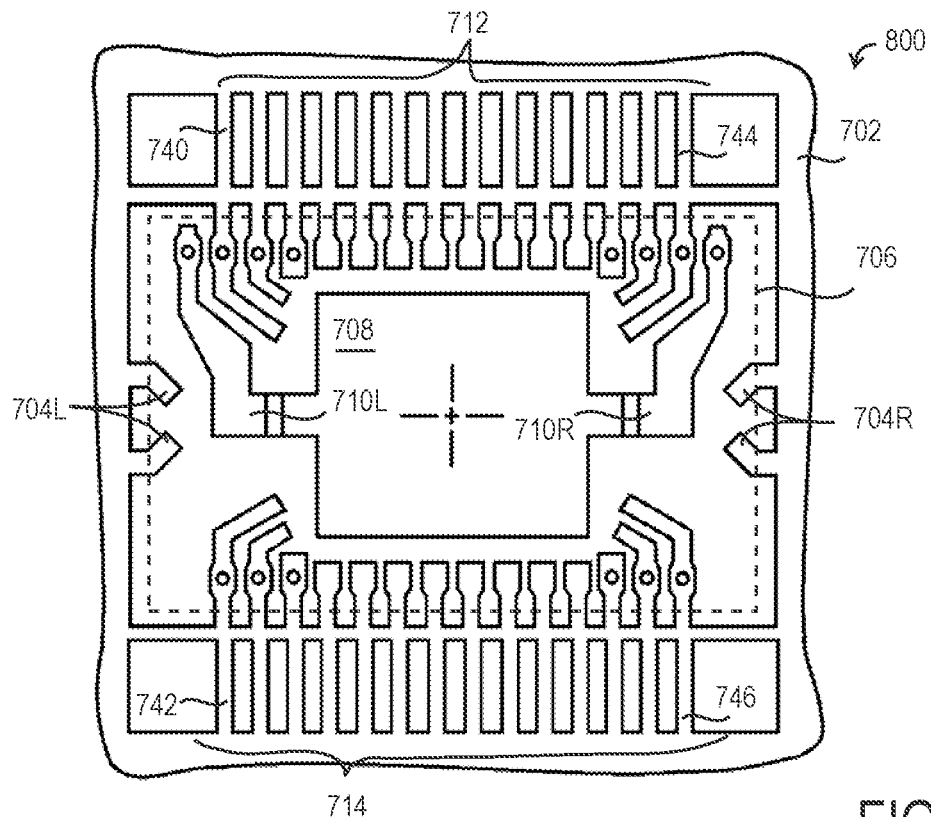
FIGS. 8A, 8B, 9A, 9B, 10A, and 10B illustrate block diagrams depicting various top-down views of semiconductor die packages built on example lead frames in which the present disclosure is implemented, according to some embodiments.

FIG. 8A shows a top-down view of another example conductive lead frame 800 in which the present disclosure is implemented. Lead frame 800 is similar in structure, dimension, and reference lead count with respect to lead frame 700, with the exception of the bottom row 714. In order to further compensate the creepage distance loss arising from the width of the intervening tie bar structures 704L and 704R, additional corner lead fingers are removed from the design of the disclosed lead frame. In the embodiment shown in FIG. 8A, two bottom corner lead fingers (in addition to the two top corner lead fingers) are removed from the design, one from the left side and one from the right side of the lead frame, resulting in an implemented lead count that is smaller than the reference lead count by four. For example, all four corner lead fingers are removed from the design and the lead frame 800 implements a bottom row 714 having a same reduced number of lead fingers as a top row 712. The absent corner lead fingers 720, 722, 724, and 726 are represented by a broken outline in FIG. 8B.

Lead fingers 742 and 746 respectively adjacent to the removed corner lead fingers in the bottom row 714 (and lead fingers 740 and 744 respectively adjacent to the removed corner lead fingers in the top row 712) become the "new" outermost lead fingers used for measuring creepage distance. Die pad arms 710L and 710R remain within package body perimeter 706 and are attached to non-conductive support structures 760 like that shown in FIG. 7C to provide structural integrity and stability for the die pad 708. The remaining lead fingers of the lead frame are not altered, where the outer portions 712O of the remaining lead fingers of the top row 712 are aligned with the outer portions 714O of the remaining lead fingers of the bottom row 714. While a reference lead count of 32 is used herein, other reference lead counts may be used, such as 28 (where the disclosed lead frame implements 24 leads) or 54 (where the disclosed lead frame implements 50 leads).

Figure 8B:
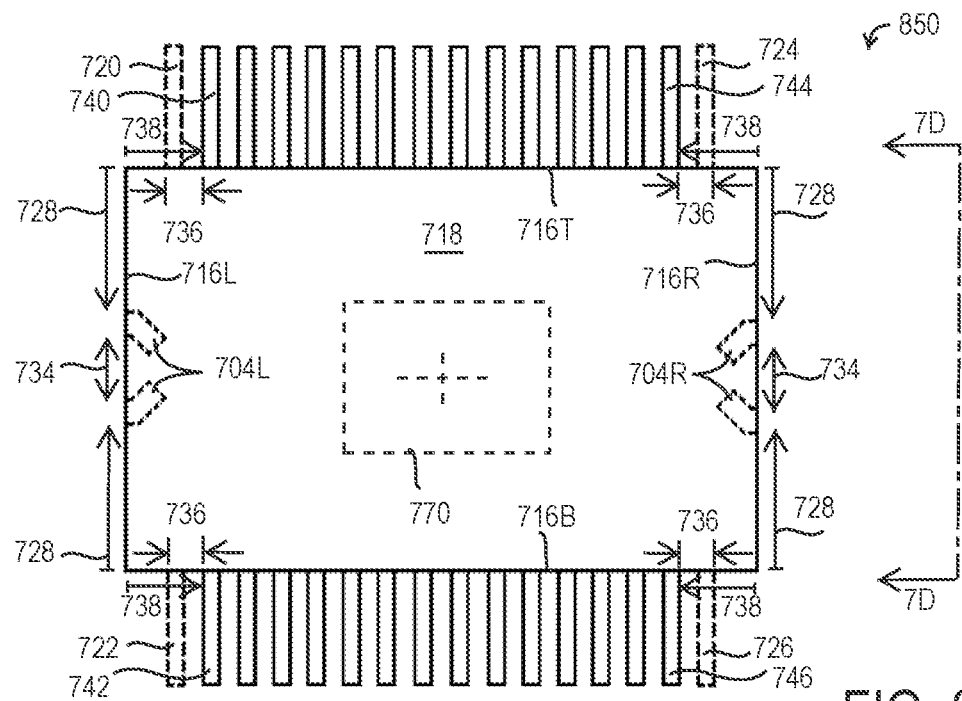

FIG. 8B shows a top-down view of a resulting semiconductor die package 850 after a semiconductor die 770 is attached to die pad 708 (shown in dashed outline), and after wirebonding, encapsulation, trim and form, and singulation, as described above. Although the package 850 has a lead count of 28, the package body 718 has similar Cdimensions as a lead frame having a lead count of 32 as described above, where the package body 718 is not superficially extended to increase creepage distance.

The creepage distance shown in FIG. 8B is equal to the sum of distance 738 measured from a top outermost lead (such as 740 or 744) to its nearest (left or right) top corner along leaded edge 716T, distance 728 from the respective top corner to the top prong of remnant 704L along the respective non-leaded edge (716L or 716R), distance 734 between top and bottom prongs, distance 728 from the bottom prong to the bottom corner along the respective non-leaded edge (716L or 716R), and distance 738 from the bottom corner to the respective bottom outermost lead (such as 742 or 746) along leaded edge 716B. As noted above, distance 738 is equal to distance 730 plus distance 736, where distance 730 is measured between a corner and a respective one of (now absent) corner leads 720, 722, 724, and 726, and distance 736 is equal to the lead pitch. It is noted that distance 736 is gained at each corner of the package 850 resulting from the removal of corner leads 720, 722, 724, and 726 from the top and bottom rows 712 and 714.

Using the example values as noted above, including a worst case of width 732 equal to 0.3 mm, an example creepage distance of package 850 with two intervening prong remnants may fall in a range of 8.7 to 9.1 mm (which may also vary depending on the number of intervening tie bar remnants still present at the package surface on sides 716L and 716R), satisfying the minimum creepage distance of 8.0 mm. A head-on view of the resulting semiconductor die package 850 is similar to that shown in FIG. 7D.

Figure 9A:
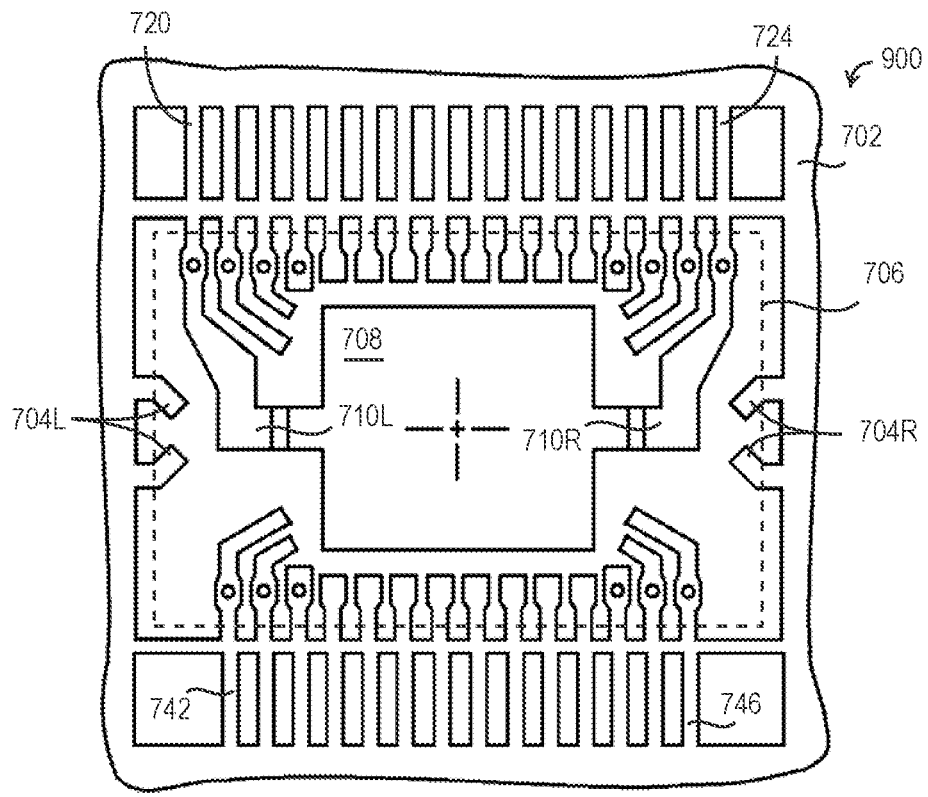

FIG. 9A shows a top-down view of another example conductive lead frame 900 in which the present disclosure is implemented. Lead frame 900 is similar in structure, dimension, and reference lead count with respect to lead frame 700, with the exception of top and bottom rows 712 and 714. In the embodiment shown in FIG. 9A, two bottom corner lead fingers (instead of the top corner lead fingers as shown in FIG. 7A) are removed from the design, one from the left side and one from the right side of the lead frame, resulting in an implemented lead count that is smaller than the reference lead count by two. The lead frame 900 implements a bottom row 714 having two fewer lead fingers as top row 712. The absent corner lead fingers 722 and 726 are represented by a broken outline in FIG. 9B. Lead fingers 742 and 746 respectively adjacent to the removed corner lead fingers in the bottom row 714 become the "new" outermost lead fingers used for measuring creepage distance. It is noted that the lead frame 900 implements the top corner lead fingers 720 and 724, which are respectively connected to die pad arms 710L and 710R. Since the die pad arms 710L and 710R are attached to the surrounding frame structure 702 by the top corner lead fingers 720 and 724, the non-conductive support structure 760 shown in FIG. 7C is not needed. The remaining lead fingers are not altered, where the outer portions 714O of the remaining lead fingers of the bottom row 714 are aligned with the outer portions 712O of the lead fingers of the top row 714.

Figure 9B:
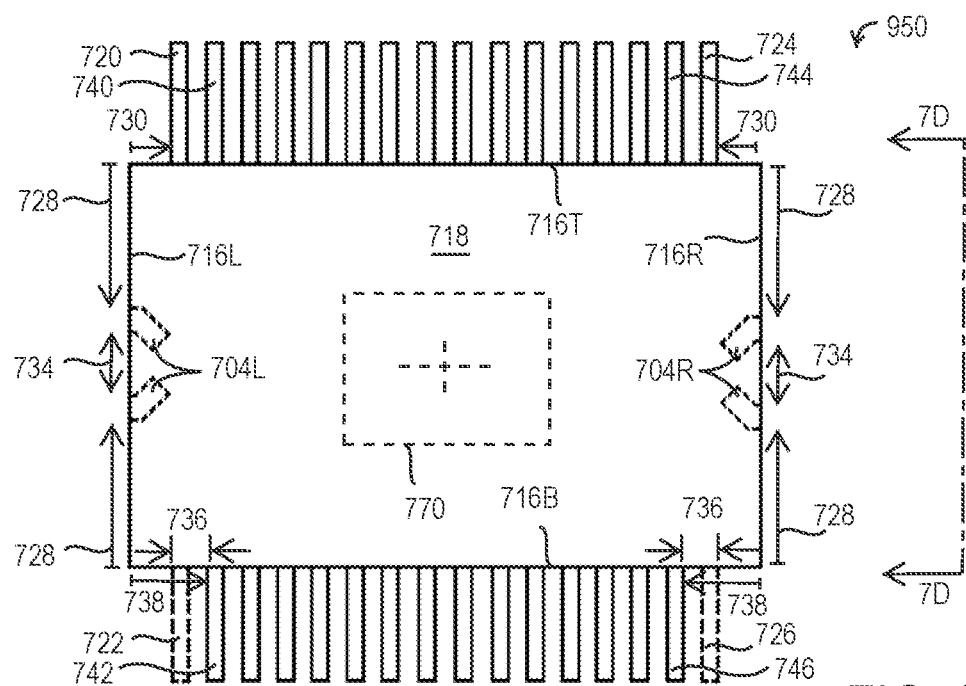

FIG. 9B shows a top-down view of a resulting semiconductor die package 950 after a semiconductor die 770 is attached to die pad 708 (shown in dashed outline), and after wirebonding, encapsulation, trim and form, and singulation, as described above. Although the package 950 has a lead count of 30, the package body 718 has similar dimensions as a lead frame having a lead count of 32 as described above, where the package body 718 is not superficially extended to increase creepage distance.

The creepage distance shown in FIG. 9B is equal to the sum of distance 730 measured from a top outermost lead (such as 720 or 724) to its nearest (left or right) top corner along leaded edge 716T, distance 728 from the respective top corner to the top prong of remnant 704L along the respective non-leaded edge (716L or 716R), distance 734 between top and bottom prongs, distance 728 from the bottom prong to the bottom corner along the respective non-leaded edge (716L or 716R), and distance 738 from the bottom corner to the respective bottom outermost lead (such as 742 or 746) along leaded edge 716B. As noted above, distance 738 is equal to distance 730 plus distance 736. It is noted that distance 736 is gained at each bottom corner of the package 950 resulting from the removal of corner leads 722 and 726 from the bottom row 714.

Using the example values as noted above, including a worst case of width 732 equal to 3.0 mm, an example creepage distance of package 950 is similar to that determined for package 750, which is a range of 8.1 to 8.5 mm. A head-on view of the resulting semiconductor die package 950 is similar to that shown in FIG. 7D.

Figure 10A:
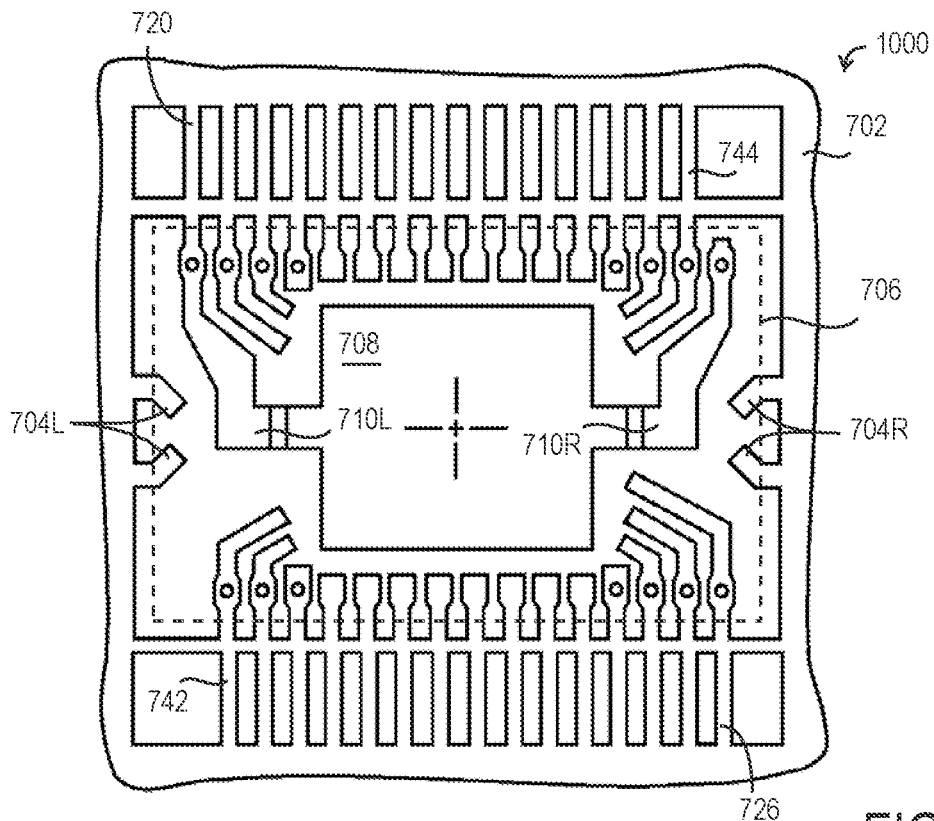

FIG. 10A shows a top-down view of another example conductive lead frame 1000 in which the present disclosure is implemented. Lead frame 1000 is similar in structure, dimension, and reference lead count with respect to lead frame 700, with the exception of top and bottom rows 712 and 714. In the embodiment shown in FIG. 10A, a combination of a top corner lead finger and a bottom corner lead finger (rather than both top corner lead fingers or both bottom corner lead fingers) are removed from the design, one from the left side and one from the right side of the lead frame, resulting in an implemented lead count that is smaller than the reference lead count by two. While top right corner lead 724 and bottom left corner lead 722 are removed in the embodiment shown, the top left corner lead 720 and the bottom right corner lead 726 may be removed in another embodiment (e.g., such an embodiment would be a mirrored lead frame of FIG. 10A). The absent corner lead fingers 724 and 722 are represented by a broken outline in FIG. 10B. Similarly, a package built on an embodiment that implements absent corner lead fingers 720 and 726 would also be a mirrored package of FIG. 10B.

Lead fingers 744 and 742 respectively adjacent to the removed corner lead fingers become the "new" outermost lead fingers used for measuring creepage distance. It is noted that the lead frame 1000 implements the top left lead finger 720 that is connected to die pad arm 710L, which does not need the non-conductive support structure 760. However, die pad arm 710R is not similarly attached to the surrounding frame structure 702, where the non-conductive support structure 760 shown in FIG. 7C is implemented for arm 710R. The remaining lead fingers are not altered, where the outer portions 714O of the remaining lead fingers of the bottom row 714 are aligned with the outer portions 712O of the lead fingers of the top row 714, and the end of die par arm 710R is aligned with outer portion of outermost lead finger 726.

Figure 10B:
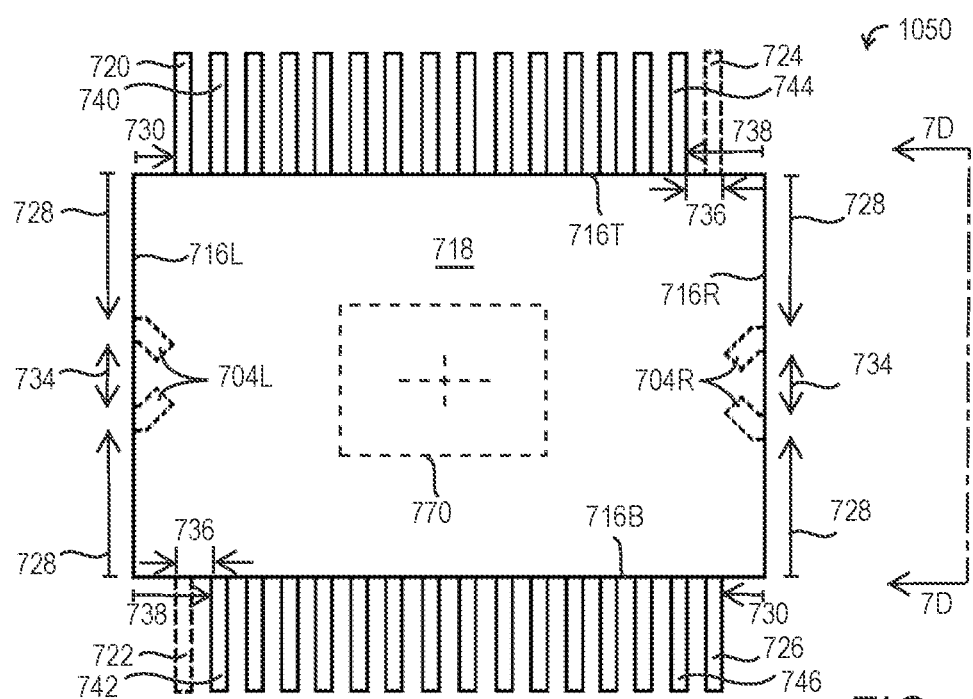

FIG. 10B shows a top-down view of a resulting semiconductor die package 1050 after a semiconductor die 770 is attached to die pad 708 (shown in dashed outline), and after wirebonding, encapsulation, trim and form, and singulation, as described above. Although the package 1050 has a lead count of 30, the package body 718 has similar dimensions as a lead frame having a lead count of 32 as described above, where the package body 718 is not superficially extended to increase creepage distance.

The creepage distance on the left and right sides is equal to the sum of distances 730, 728, 734, 728, and 738 between the right pair or the left pair of outermost leads. Using the example values as noted above, including a worst case of width 732 equal to 3.0 mm, an example creepage distance of package 1050 is similar to that determined for package 750, which is a range of 8.1 to 8.5 mm. A head-on view of the resulting semiconductor di package 1050 is similar to that shown in FIG. 7D.

Semiconductor die 770 may be singulated from a semiconductor wafer, which can be any semiconductor material or combinations of materials, such as gallium arsenide, silicon germanium, silicon-on-insulator (SOI), silicon, monocrystalline silicon, the like, and combinations of the above. The active circuitry of the semiconductor die 770 may include integrated circuit components that are active when the die 770 is powered. The active circuitry is formed is formed using a sequence of numerous process steps applied to the semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of integrated circuit components include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device.

In other embodiments, an electronic component may be attached to the die pad 708 of the lead frame 700. Examples of an electronic component include but are not limited to a passive device, such as a relay, a resistor, an inductor, a capacitor, a diode, a power transistor, an oscillator, and the like, another type of electronic device, and a semiconductor device, such as a semiconductor die, described above. Such an embodiment may still be processed in the same manner as described below (e.g., attachment to the lead frame, encapsulated, trim and form, singulation), resulting in a packaged electronic device.

By now it should be appreciated that there has been provided a modified lead frame design for a semiconductor die package in which corner leads are removed to increase the creepage distance between a pair of outermost leads that require high voltage isolation.

In an embodiment of the present disclosure, a lead frame for a packaged semiconductor device is provided, the lead frame including: a first row of lead fingers and a second row of lead fingers, wherein an outer end of each lead finger of the first row is connected to a first side of the lead frame, and an outer end of each lead finger of the second row is connected to a second side of the lead frame, the second side is opposite the first side; a package body perimeter within which a package body of the packaged semiconductor device is formed; and a first die pad arm, wherein an end of the first die pad arm remains within the package body perimeter and is separated from the package body perimeter by a gap distance; wherein a first outermost lead finger of the first row of lead fingers is adjacent to the first die pad arm.

One aspect of the above embodiment provides that the lead frame further includes: a non-conductive support structure attached to a portion of the first die pad arm and to an inner portion of at least the first outermost lead finger.

Another aspect of the above embodiment provides that a second outermost lead finger of the second row of lead fingers is aligned with the end of the first die pad arm.

Another aspect of the above embodiment provides that a second outermost lead finger of the second row of lead fingers is aligned with the first outermost lead finger.

Another aspect of the above embodiment provides that the lead frame further includes: a second die pad arm, wherein an end of the second die pad arm remains within the package body perimeter and is separated from the package body perimeter by the gap distance.

Another aspect of the above embodiment provides that the lead frame further includes: a second die pad arm that is connected to a second outermost lead finger of the first row of lead fingers.

A further aspect of the above embodiment provides that the second outermost lead finger is adjacent to a first neighboring lead finger, and a third outermost lead finger of the second row of lead fingers is aligned with the first neighboring lead finger.

In another embodiment of the present disclosure, a lead frame for a packaged semiconductor device is provided, the lead frame including: a first row of lead fingers and a second row of lead fingers, wherein an outer end of each lead finger of the first row is connected to a first side of the lead frame, and an outer end of each lead finger of the second row is connected to a second side of the lead frame, the second side is opposite the first side; and a first die pad arm connected to a first outermost lead finger of the first row of lead fingers, the first outermost lead finger is adjacent to a first neighboring lead finger of the first row of lead fingers; wherein a second outermost lead finger of the second row of lead fingers is aligned with the first neighboring lead finger.

One aspect of the above embodiment provides that the lead frame further includes: a second die pad arm connected to a third outermost lead finger of the first row of lead fingers, the third outermost lead finger is adjacent to a second neighboring lead finger of the first row of lead fingers; wherein a fourth outermost lead finger of the second row of lead fingers is aligned with the second neighboring lead finger.

Another aspect of the above embodiment provides that the lead frame further includes: a second die pad arm, wherein an end of the first die pad arm has an end that is not connected to the first side of the lead frame; wherein a third outermost lead finger of the second row of lead fingers is aligned with the end of the first die pad arm.

In another embodiment of the present disclosure, a packaged electronic device is provided, the device including: a die pad to which an electronic component is attached, the die pad having a pair of die pad arms; a package body formed around the electronic component and the die pad; and a first row of leads extending from a first side of the package body and a second row of leads extending from a second side of the package body, the second side opposing the first side; wherein an end of a first die pad arm remains within the package body and is separated from a surface of the package body by a gap distance.

One aspect of the above embodiment provides that the packaged electronic device further includes: a non-conductive support structure embedded within the package body, wherein the non-conductive support structure is attached to a portion of the first die pad arm and to an inner portion of at least one lead that is adjacent to the first die pad arm.

Another aspect of the above embodiment provides that the first die pad arm is adjacent to a first outermost lead of the first row of leads, and a second outermost lead of the second row of leads is aligned with the first outermost lead.

A further aspect of the above embodiment provides that an end of a second die pad arm remains within the package body and is adjacent to a third outermost lead of the first row of leads, and a fourth outermost lead of the second row of leads is aligned with the third outermost lead.

Another aspect of the above embodiment provides that a first outermost lead of the first row of leads is separated from a second outermost lead of the second row of leads by a creepage distance measured along the surface of the package body, and the creepage distance is equal to or larger than 8.0 mm.

In another embodiment of the present disclosure, a packaged electronic device is provided, the device including: a die pad to which an electronic component is attached; a package body formed around the electronic component and the die pad; and a first row of leads extending from a first side of the package body and a second row of leads extending from a second side of the package body, the second side opposing the first side; wherein a first distance along a surface of the package body measured from a corner of the first side to a first outermost lead extending from the first side is greater than a second distance along the surface of the package body measured from a corner of the second side to a second outermost lead extending from the second side.

One aspect of the above embodiment provides that the first distance is equal to the second distance plus a lead width and a lead spacing width.

Another aspect of the above embodiment provides that the second row of leads includes at least one more lead than the first row of leads.

Another aspect of the above embodiment provides that the packaged electronic device further includes: one or more tie-bar remnants embedded within the package body and having at least one end that is exposed at the surface on a third side of the package body, the third side perpendicular to the first and second sides.

Another aspect of the above embodiment provides that the first outermost lead is separated from the second outermost lead by a creepage distance measured along the surface of the package body, including the first and second distances, and the creepage distance is equal to or larger than 8.0 mm.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein, the terms "substantial" and "substantially" mean sufficient to achieve the stated purpose or value in a practical manner, taking into account any minor imperfections or deviations, if any, that arise from usual and expected process abnormalities and tolerances that may occur during wafer fabrication or semiconductor die packaging, which are not significant for the stated purpose or value.

Although the invention is described herein with reference to specific embodiments, various modifications and changes can be made without departing from the scope of the present invention as set forth in the claims below. For example, support structure 760 in FIG. 7C may be attached to additional or fewer adjacent lead fingers in other embodiments. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A lead frame for a packaged semiconductor device, the lead frame comprising:
    a first row of lead fingers and a second row of lead fingers, wherein an outer end of each lead finger of the first row is connected to a first side of the lead frame, and an outer end of each lead finger of the second row is connected to a second side of the lead frame, the second side is opposite the first side, and wherein a third side of the lead frame is perpendicular to the first and second sides of the lead frame;
    a package body perimeter within which a package body of the packaged semiconductor device is formed; and
    a first die pad arm, wherein an end of the first die pad arm remains within the package body perimeter and is separated from the package body perimeter by a gap distance;
    wherein a first outermost lead finger of the first row of lead fingers is adjacent to the first die pad arm, such that, within the package body perimeter:
        a portion of the first outermost lead finger is parallel to the third side, and
        as determined along a line parallel to the first side taken through the end of the first pad die arm, the end of the first pad die arm is between the third side and the portion of the first outermost lead finger which is parallel to the third side.

2. The lead frame of claim 1, further comprising:
a non-conductive support structure attached to a portion of the first die pad arm and to an inner portion of at least the first outermost lead finger.

3. The lead frame of claim 1, wherein
a second outermost lead finger of the second row of lead fingers is aligned with the end of the first die pad arm.

4. The lead frame of claim 1, wherein
a second outermost lead finger of the second row of lead fingers is aligned with the first outermost lead finger.

5. The lead frame of claim 1, further comprising:
a second die pad arm, wherein an end of the second die pad arm remains within the package body perimeter and is separated from the package body perimeter by the gap distance.

6. The lead frame of claim 1, further comprising:
a second die pad arm, wherein the second die pad arm and a second outermost lead finger of the first row of lead fingers are a continuous conductive material.

7. The lead frame of claim 6, wherein
the second outermost lead finger is adjacent to a first neighboring lead finger, and
a third outermost lead finger of the second row of lead fingers is aligned with the first neighboring lead finger.

8. A lead frame for a packaged semiconductor device, the lead frame comprising:
a first row of lead fingers and a second row of lead fingers, wherein an outer end of each lead finger of the first row is connected to a first side of the lead frame, and an outer end of each lead finger of the second row is connected to a second side of the lead frame, the second side is opposite the first side; and
a first die pad arm, wherein the first die pad arm and a first outermost lead finger of the first row of lead fingers are a continuous conductive material, and the first outermost lead finger is adjacent to a first neighboring lead finger of the first row of lead fingers;
wherein a second outermost lead finger of the second row of lead fingers is aligned with the first neighboring lead finger.

9. The lead frame of claim 8, further comprising:
a second die pad arm, wherein the second die pad arm and a third outermost lead finger of the first row of lead fingers are a continuous conductive material, the third outermost lead finger is adjacent to a second neighboring lead finger of the first row of lead fingers;
wherein a fourth outermost lead finger of the second row of lead fingers is aligned with the second neighboring lead finger.

10. The lead frame of claim 8, further comprising:
a second die pad arm, wherein an end of the second die pad arm has an end that is not connected to the first side of the lead frame;
wherein a third outermost lead finger of the second row of lead fingers is aligned with the end of the second die pad arm.

11. A packaged electronic device comprising:
a die pad to which an electronic component is attached, the die pad having a pair of die pad arms;
a package body formed around the electronic component and the die pad; and
a first row of leads extending from a first side of the package body and a second row of leads extending from a second side of the package body, the second side opposing the first side, and wherein a third side of the lead frame is perpendicular to the first and second sides of the lead frame;
wherein an end of a first die pad arm remains within the package body and is separated from a surface of the package body by a gap distance;
wherein a first outermost lead finger of the first row of lead fingers is adjacent to the first die pad arm, such that, within the package body:
a portion of the first outermost lead finger and is parallel to the third side, and
as determined along a line parallel to the first side taken through the end of the first pad die arm, the end of the first pad die arm is between the third side and the portion of the first outermost lead finger which is parallel to the third side.

12. The packaged electronic device of claim 11, further comprising:
a non-conductive support structure embedded within the package body, wherein the non-conductive support structure is attached to a portion of the first die pad arm and to an inner portion of at least one lead that is adjacent to the first die pad arm.

13. The packaged electronic device of claim 11, wherein
a second outermost lead of the second row of leads is aligned with the first outermost lead.

14. The packaged electronic device of claim 13, wherein
an end of a second die pad arm remains within the package body and is adjacent to a third outermost lead of the first row of leads, such that, within the package body:
a portion of the third outermost lead finger and a portion of the second die pad arm are parallel to a fourth side, opposite the third side, and
the end of the second pad die arm is between the fourth side and the portion of the third outermost lead finger which is parallel to the fourth side, and
a fourth outermost lead of the second row of leads is aligned with the third outermost lead.

15. The packaged electronic device of claim 11, wherein
the first outermost lead of the first row of leads is separated from a second outermost lead of the second row of leads by a creepage distance measured along the surface of the package body, and
the creepage distance is equal to or larger than 8.0 mm.

16. A packaged electronic device comprising:
a die pad to which an electronic component is attached;
a package body formed around the electronic component and the die pad; and
a first row of leads extending from a first side of the package body and a second row of leads extending from a second side of the package body, the second side opposing the first side;
a first die pad arm, wherein the first die pad arm and a first outermost lead finger of the first row of lead fingers are a continuous conductive material, and the first outermost lead finger is adjacent to a first neighboring lead finger of the first row of lead fingers;
wherein a second outermost lead finger of the second row of lead fingers is aligned with the first neighboring lead finger.

17. The packaged electronic device of claim 16, wherein
the second row of leads includes at least one more lead than the first row of leads.

18. The packaged electronic device of claim 16, further comprising:

one or more tie-bar remnants embedded within the package body and having at least one end that is exposed at the surface on a third side of the package body, the third side perpendicular to the first and second sides.

19. The packaged electronic device of claim 16, wherein wherein a first distance along a surface of the package body measured from a corner of the first side to the first outermost lead extending from the first side is greater than a second distance along the surface of the package body measured from a corner of the second side to the second outermost lead extending from the second side.

20. The packaged electronic device of claim 19, wherein the first distance is equal to the second distance plus a lead width and a lead spacing width.

21. The packaged electronic device of claim 19, wherein the first outermost lead is separated from the second outermost lead by a creepage distance measured along the surface of the package body, including the first and second distances, and
the creepage distance is equal to or larger than 8.0 mm.

* * * * *